US006824622B2

(12) United States Patent
Liu et al.

(10) Patent No.: US 6,824,622 B2
(45) Date of Patent: Nov. 30, 2004

(54) CLEANER AND METHOD FOR REMOVING FLUID FROM AN OBJECT

(75) Inventors: Yi-Chang Liu, Kaohsiung (TW); Chia-Chen Chang, Kaohsiung (TW); Yuan-Mou Dai, Taoyuan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 80 days.

(21) Appl. No.: 10/184,320

(22) Filed: Jun. 27, 2002

(65) Prior Publication Data

US 2004/0000328 A1 Jan. 1, 2004

(51) Int. Cl.[7] ................................................ B08B 3/02
(52) U.S. Cl. ........................ 134/30; 134/18; 134/25.4; 134/32; 134/37; 134/56 R; 134/57 R; 134/58 R; 134/95.2; 134/95.3; 134/902
(58) Field of Search .................... 134/30, 25.4, 32, 134/37, 18, 902, 56 R, 57 R, 58 R, 95.2, 95.3, 90.2

(56) References Cited

U.S. PATENT DOCUMENTS

| | | | | |
|---|---|---|---|---|
| 5,863,348 A | * | 1/1999 | Smith et al. | 134/18 |
| 6,115,867 A | * | 9/2000 | Nakashima et al. | 15/77 |
| 6,131,588 A | * | 10/2000 | Kamikawa et al. | 134/102.3 |

* cited by examiner

*Primary Examiner*—Zeinab El-Arini
(74) *Attorney, Agent, or Firm*—Tung & Associates

(57) ABSTRACT

A cleaner and method for removing excess residual cleaning fluid from an object, particularly a semiconductor wafer, before or as the wafer is removed from a cleaning chamber of a CMP cleaner, for example. Typically, a purge bar is mounted on each side of the cleaning chamber for blowing nitrogen or clean, dry air (CDA) against a corresponding surface of the wafer to remove the excess cleaning fluid from the wafer. The purge bars may be connected to a controller for a wafer transfer device which removes the wafer from the cleaning chamber, such that the purge bars are actuated as the wafer transfer device begins to remove the wafer from the chamber.

20 Claims, 2 Drawing Sheets

CLEANER AND METHOD FOR REMOVING FLUID FROM AN OBJECT

FIELD OF THE INVENTION

The present invention relates to CMP cleaners for cleaning semiconductor wafers after chemical mechanical polishing (CMP). More particularly, the present invention relates to purge bars for purging excess cleaning fluid from a wafer after a CMP cleaning to reduce the chemical concentration in the environment of the cleaner.

BACKGROUND OF THE INVENTION

In the fabrication of semiconductor devices from a silicon wafer, a variety of semiconductor processing equipment and tools are utilized. One of these processing tools is used for polishing thin, flat semiconductor wafers to obtain a planarized surface. A planarized surface is highly desirable on a shadow trench isolation (STI) layer, inter-layer dielectric (ILD) or on an inter-metal dielectric (IMD) layer, which are frequently used in memory devices. The planarization process is important since it enables the subsequent use of a high refluid lithographic process to fabricate the next-level circuit. The accuracy of a high refluid lithographic process can be achieved only when the process is carried out on a substantially flat surface. The planarization process is therefore an important processing step in the fabrication of semiconductor devices.

A global planarization process can be carried out by a technique known as chemical mechanical polishing, or CMP. The process has been widely used on ILD or IMD layers in fabricating modern semiconductor devices. A CMP process is performed by using a rotating platen in combination with a pneumatically-actuated polishing head. The process is used primarily for polishing the front surface or the device surface of a semiconductor wafer for achieving planarization and for preparation of the next level processing. A wafer is frequently planarized one or more times during a fabrication process in order for the top surface of the wafer to be as flat as possible. A wafer can be polished in a CMP apparatus by being placed on a carrier and pressed face down on a polishing pad covered with a slurry of colloidal silica or aluminum.

A polishing pad used on a rotating platen is typically constructed in two layers overlying a platen, with a resilient layer as an outer layer of the pad. The layers are typically made of a polymeric material such as polyurethane and may include a filler for controlling the dimensional stability of the layers. A polishing pad is typically made several times the diameter of a wafer in a conventional rotary CMP, while the wafer is kept off-center on the pad in order to prevent polishing of a non-planar surface onto the wafer. The wafer itself is also rotated during the polishing process to prevent polishing of a tapered profile onto the wafer surface. The axis of rotation of the wafer and the axis of rotation of the pad are deliberately not collinear; however, the two axes must be parallel. It is known that uniformity in wafer polishing by a CMP process is a function of pressure, velocity and concentration of the slurry used.

A CMP process is frequently used in the planarization of an ILD or IMD layer on a semiconductor device. Such layers are typically formed of a dielectric material. A most popular dielectric material for such usage is silicon oxide. In a process for polishing a dielectric layer, the goal is to remove typography and yet maintain good uniformity across the entire wafer. The amount of the dielectric material removed is normally between about 5000 A and about 10,000 A. The uniformity requirement for ILD or IMD polishing is very stringent since non-uniform dielectric films lead to poor lithography and resulting window-etching or plug-formation difficulties. The CMP process has also been applied to polishing metals, for instance, in tungsten plug formation and in embedded structures. A metal polishing process involves a polishing chemistry that is significantly different than that required for oxide polishing.

Important components used in CMP processes include an automated rotating polishing platen and a wafer holder, which both in exert a pressure on the wafer and rotate the wafer independently of the platen. The polishing or removal of surface layers is accomplished by a polishing slurry consisting mainly of colloidal silica suspended in deionized water or KOH fluid. The slurry is frequently fed by an automatic slurry feeding system in order to ensure uniform wetting of the polishing pad and proper delivery and recovery of the slurry. For a high-volume wafer fabrication process, automated wafer loading/unloading and a cassette handler are also included in a CMP apparatus.

As the name implies, a CMP process executes a microscopic action of polishing by both chemical and mechanical means. While the exact mechanism for material removal of an oxide layer is not known, it is hypothesized that the surface layer of silicon oxide is removed by a series of chemical reactions which involve the formation of hydrogen bonds with the oxide surface of both the wafer and the slurry particles in a hydrogenation reaction; the formation of hydrogen bonds between the wafer and the slurry; the formation of molecular bonds between the wafer and the slurry; and finally, the breaking of the oxide bond with the wafer or the slurry surface when the slurry particle moves away from the wafer surface. It is generally recognized that the CMP polishing process is not a mechanical abrasion process of slurry against a wafer surface.

While the CMP process provides a number of advantages over the traditional mechanical abrasion type polishing process, a serious drawback for the CMP process is the difficulty in controlling polishing rates at different locations on a wafer surface. Since the polishing rate applied to a wafer surface is generally proportional to the relative rotational velocity of the polishing pad, the polishing rate at a specific point on the wafer surface depends on the distance from the axis of rotation. In other words, the polishing rate obtained at the edge portion of the wafer that is closest to the rotational axis of the polishing pad is less than the polishing rate obtained at the opposite edge of the wafer. Even though this is compensated for by rotating the wafer surface during the polishing process such that a uniform average polishing rate can be obtained, the wafer surface, in general, is exposed to a variable polishing rate during the CMP process.

Recently, a chemical mechanical polishing method has been developed in which the polishing pad is not moved in a rotational manner but instead, in a linear manner. It is therefore named as a linear chemical mechanical polishing process, in which a polishing pad is moved in a linear manner in relation to a rotating wafer surface. The linear polishing method affords a more uniform polishing rate across a wafer surface throughout a planarization process for the removal of a film layer from the surface of a wafer. One added advantage of the linear CMP system is the simpler construction of the apparatus, and this not only reduces the cost of the apparatus but also reduces the floor space required in a clean room environment.

An important challenge in CMP is to produce a clean substrate surface following polishing. Therefore, a primary concern with the use of CMP is the efficient and complete removal of the polishing slurry and other polishing residues and particulates following polishing in order to prevent introduction of defects into the polished product. Ideally, post-CMP cleaning should remove all polishing slurry, polishing residues and particulates in a quick and repeatable fashion without introducing additional defects or damage to the substrate surface. Cleaning procedures following CMP typically include use of a DI (deionized) water rinse and a scrub with a soft rotating brush to remove slurry residue from the surface of the semiconductor substrate. However, use of a DI water rinse alone causes the brush to become loaded with particles, which tend to contaminate other wafers. Accordingly, ammonium hydroxide, hydrogen fluoride, hydrogen peroxide and other chemicals may be used in conjunction with water to clean the wafers.

A typical conventional CMP cleaner for cleaning wafers after chemical mechanical polishing is generally indicated by reference numeral 10 in FIG. 1. The CMP cleaner 10 includes multiple cleaning chambers 12 (three of which are shown), each of which contains a pair of opposing spray nozzles 16, a pair of scrub brushes 20 and a bottom roller 22. The spray nozzles 16 of each cleaning chamber 12 spray a particular chemical cleaning fluid 18, typically including DI water, ammonium hydroxide, hydrogen peroxide or hydrogen fluoride, for example, on opposite surfaces of a wafer 24 as the roller 22 rotates the wafer 24 in the cleaning chamber 12. A lid 14 is provided on each cleaning chamber 12. A wafer transfer mechanism 26, such as a "walking beam", sequentially transfers each wafer 24 among the multiple cleaning chambers 12 to facilitate cleaning each wafer 24 with a different cleaning fluid 18 throughout the wafer cleaning operation.

One of the problems encountered as the walking beam 26 transfers each wafer 24 among the multiple cleaning chambers 12 is that residual cleaning fluid 18 remaining on the wafer 24 tends to drop on the lid 14 after the walking beam 26 lifts the wafer 24 from the cleaning chamber 12. This undesirably increases the concentration of the cleaning fluid 18 in the environment of the CMP cleaner 10. Accordingly, a device is needed for removing residual drops of cleaning fluid 18 from both surfaces of each wafer 24 before the wafer 24 is removed from each cleaning chamber 12 of the CMP cleaner 10.

An object of the present invention is to provide an apparatus for reducing or preventing dripping or spillage of residual cleaning fluid from an object during or after removal of the object from a cleaning chamber.

Another object of the present invention is to provide an apparatus for removing residual cleaning fluid from an object before or as the object is removed from a cleaning chamber.

Yet another object of the present invention is to provide a method for removing residual cleaning fluid from an object before or as the object is removed from a cleaning chamber.

Still another object of the present invention is to provide an apparatus for removing residual cleaning fluid from a semiconductor wafer before the wafer is transferred from one cleaning chamber to another cleaning chamber in a chemical mechanical polishing (CMP) cleaner.

Another object of the present invention is to provide an apparatus which reduces undesired chemical concentration in an environment surrounding a CMP cleaner.

SUMMARY OF THE INVENTION

In accordance with these and other objects and advantages, the present invention comprises purge bars for blowing excess residual cleaning fluid from an object, particularly a semiconductor wafer, before or as the wafer is removed from a cleaning chamber of a CMP cleaner, for example. Typically, a purge bar is mounted on each side of the cleaning chamber for blowing nitrogen or clean, dry air (CDA) against a corresponding surface of the wafer to remove the excess cleaning fluid from the wafer. The purge bars may be connected to a controller for a wafer transfer device which removes the wafer from the cleaning chamber, such that the purge bars are actuated as the wafer transfer device begins to remove the wafer from the chamber.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in removing excess residual cleaning fluid from semiconductor wafers in a CMP cleaner. However, the invention is not so limited in application, and while references may be made to such CMP cleaners, the invention is more generally applicable to removing cleaning fluid from objects in a variety of industrial and mechanical applications.

Figure 1:
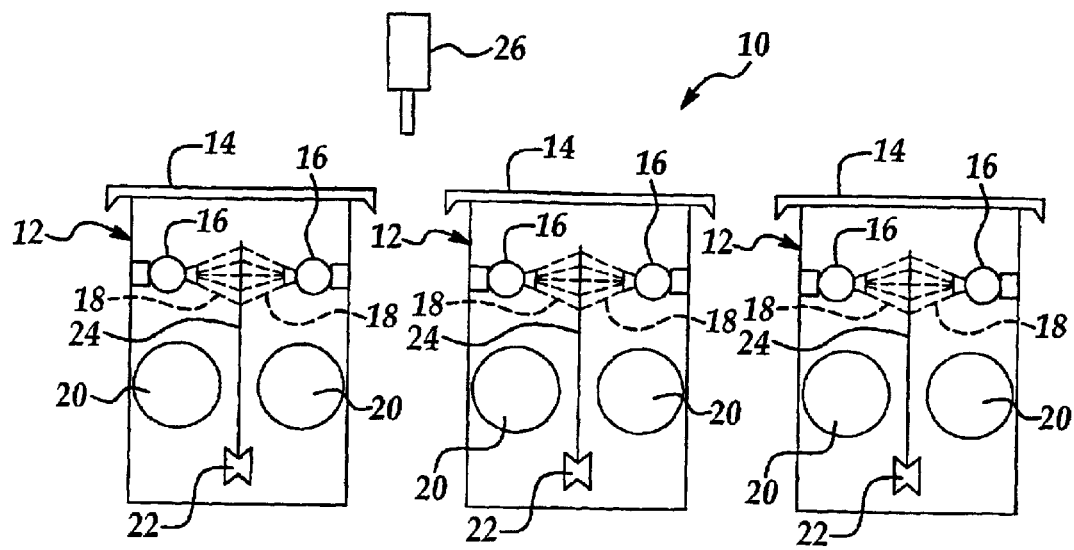
FIG. 1 illustrates three cleaning chambers of a typical conventional CMP cleaner.
Figure 2:
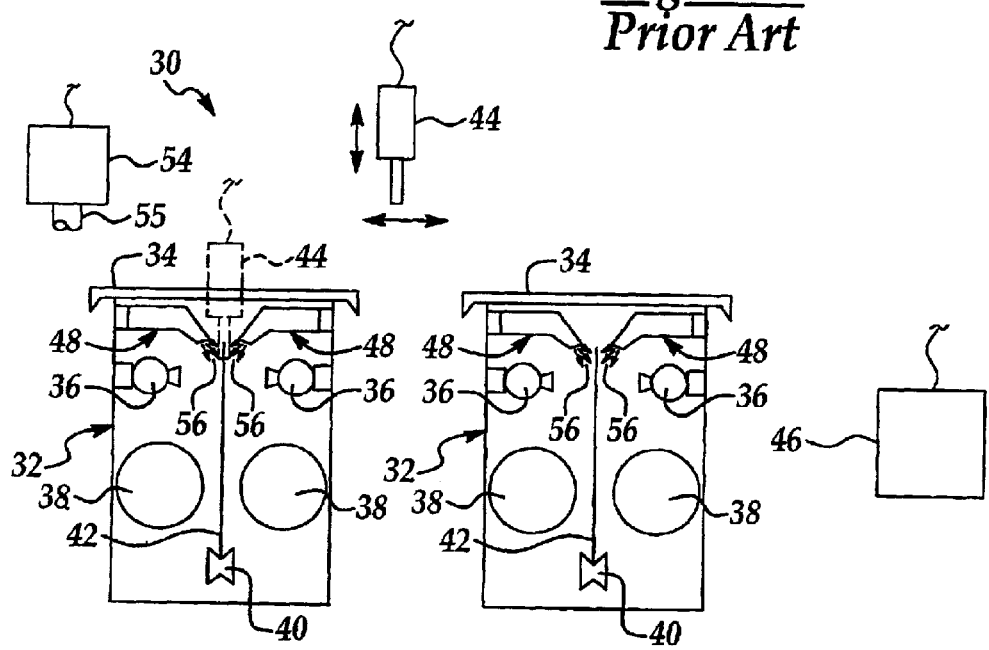
FIG. 2 illustrates a CMP cleaner in implementation of the present invention.

Referring initially to FIG. 2, an illustrative embodiment of a CMP cleaner in implementation of the present invention is generally indicated by reference numeral 30. The CMP cleaner 30 typically includes multiple, clustered cleaning chambers 32, two of which are shown, in which cleaning chambers 32 a wafer 42, having been previously polished in a CMP process, is sequentially transferred to remove particulate impurities, polishing slurry, polishing residues and other artifacts of the CMP process from the wafer 42. Each of the cleaning chambers 32 contains one or multiple rollers 40 for engaging and rotating a wafer 42 in the cleaning chamber 32 during the cleaning process, as hereinafter further described; a scrub brush 38 on each side of the cleaning chamber 32; a spray nozzle 36 typically disposed above each scrub brush 38; and a purge bar 48 on each side of the cleaning chamber 32, above the corresponding spray nozzle 36. A lid 34 closes the interior of the cleaning chamber 32, and each purge bar 48 is mounted beneath the lid 34. A gas source 54, which contains a supply of an inert gas such as nitrogen gas or CDA (clean, dry air), for example, is connected to each purge bar 48 through a gas conduit 55. A wafer transfer mechanism 44, such as a "walking beam", is mounted above the cleaning chambers 32 for initially placing a wafer 42 vertically inside each cleaning chamber 32, removing the wafer 42 from the cleaning chamber 32, and transferring the wafer 42 to the next cleaning chamber 32 in the cleaning sequence, in conventional fashion. A controller 46 is operably connected to the wafer transfer mechanism 44 for automated control of the wafer transfer mechanism 44, and may further be connected to the gas source 54 for automated discharge of purge gas 56 from each purge bar 48, as shown in FIG. 2 and hereinafter described.

Figure 2A:
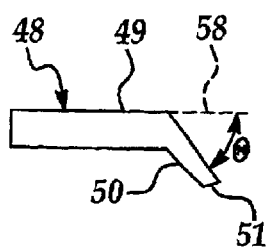
FIG. 2A illustrates a purge bar component of each cleaning chamber of the CMP cleaner in implementation of the present invention.
Figure 3:
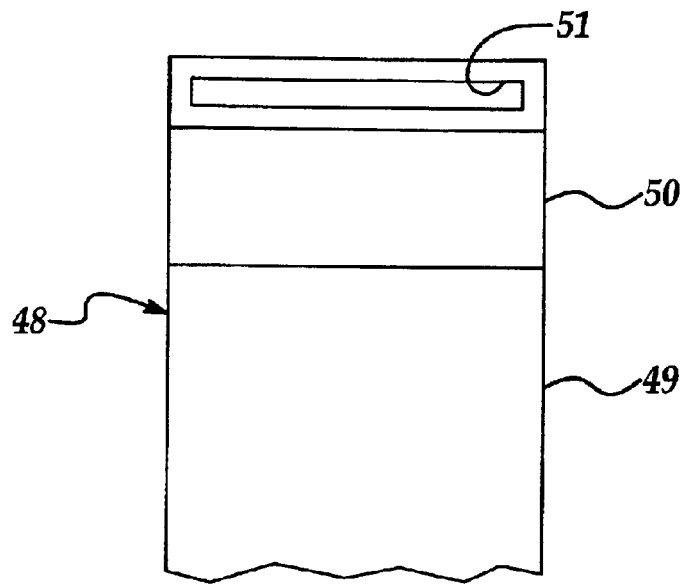
FIG. 3 is a bottom view of the purge bar, partially in section.
Figure 4:
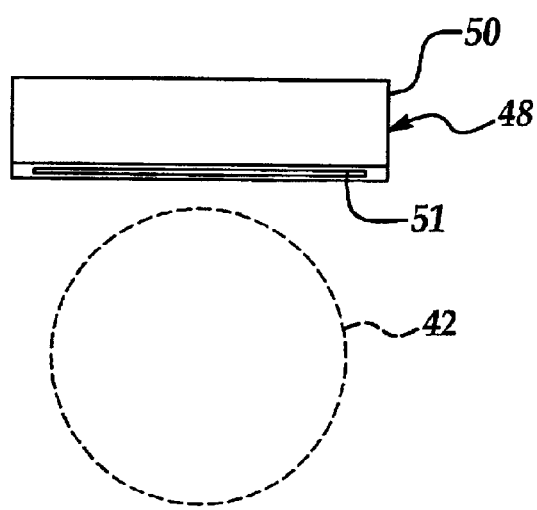
FIG. 4 is a front view of the purge bar, with a vertical wafer shown in phantom.

Referring to FIGS. 2A–4, each purge bar 48 typically includes a main portion 49 which is provided in fluid communication with the conduit 55 of the gas source 54 (FIG. 2). A nozzle 50 angles downwardly from the main portion 49, typically at about a 45° angle (θ) with respect to a horizontal axis 58, as shown in FIG. 2A. The nozzle 50 has an elongated, rectangular configuration when viewed from the bottom (FIG. 3) and front (FIG. 4), and terminates in an elongated nozzle slot 51. As shown in FIG. 4, the length of the nozzle slot 51 is preferably larger than the diameter of the wafer 42. For example, the nozzle slot 51 typically has a length of at least 10 inches for adequate treatment of a wafer 42 having a diameter of 8 inches.

Referring again to FIG. 2, typical operation of the CMP cleaner 30 of the present invention proceeds as follows. First, the wafer transfer mechanism 44 grasps a wafer 42 previously subjected to a CMP process, and lowers the wafer 42 initially into the interior of the first cleaning chamber 32 in the cleaning sequence. Next, the spray nozzles 36 are operated to spray a chemical cleaning fluid (not shown), which may contain ammonium hydroxide, hydrogen fluoride or hydrogen peroxide, for example, against respective surfaces of the wafer 42 as the wafer 42 is rotated in the cleaning chamber 32 by operation of the roller or rollers 40. Simultaneously, the scrub brushes 38 are operated to scrub the respective surfaces of the wafer 42 and remove polishing slurry, polishing residues and particulates resulting from the CMP operation from the wafer 42. The spray nozzles 36 and scrub brushes 38 are operated to effect the post-CMP cleaning operation according to operating procedures and parameters which are well-known by those skilled in the art.

After both sides of the wafer 42 are cleaned as heretofore described, a substantial quantity of residual cleaning fluid remains on each surface of the wafer 42, and this excess residual cleaning fluid should be removed from the wafer 42 prior to removing the wafer 42 from the cleaning chamber 32 and transfer of the wafer 42 to the next cleaning chamber 32 in the cleaning sequence to prevent the cleaning fluid from dripping on the lid 34 of the cleaning chamber 32. As the wafer transfer mechanism 44, disposed in the lowered position indicated by the phantom lines in FIG. 2, grasps the wafer 42 for removal of the wafer 42 from the cleaning chamber 32, operation of the gas source 54 is begun. Accordingly, as the wafer transfer mechanism 44 begins to lift and remove the wafer 42 from the cleaning chamber 32, the spray nozzles 36 blow nitrogen, CDA or other inert purge gas 56 simultaneously against the respective surfaces of the wafer 42 by operation of the gas source 54. This blowing action of the spray nozzles 36 is typically automatically commenced by operation of the controller 46 as the controller 46 begins to actuate lifting of the wafer transfer mechanism 44 from the cleaning chamber 32. However, it is understood that the purge bars 48 may instead be manually actuated to begin blowing the purge gas 56 against the wafer 42, according to the knowledge of those skilled in the art.

The purge gas 56 flowing from each purge bar 48 impinges against the wafer 42 at a pressure of typically about 2–20 psi, and preferably, about 5 psi. The flowing purge gas 56 blows the excess cleaning fluid from the wafer 42 and into the cleaning chamber 32 such that most of the excess cleaning fluid has been removed from the wafer 42 by the time the wafer 42 has been completely removed from the cleaning chamber 32. Some of the cleaning fluid typically remains on the wafer 42 for subsequent transfer of the wafer 42 to a SRD (spin-rinse-dry) station (not shown). The wafer transfer mechanism 44 then transfers the cleaned wafer 42 from the first cleaning chamber 32 to the next cleaning chamber 32 in the cleaning sequence, in which second cleaning chamber 32 the cleaning process is repeated typically using a different cleaning fluid. The purge bars 48 of the second cleaning chamber 32 are operated in the same manner as those of the first cleaning chamber 32 to remove excess cleaning fluid from the wafer 42.

While the preferred embodiments of the invention have been described above, it will be recognized and understood that various modifications can be made in the invention and the appended claims are intended to cover all such modifications which may fall within the spirit and scope of the invention.

Having described our invention with the particularity set forth above, we claim:

1. A cleaner for removing excess wet cleaning fluid from an object, comprising:
    at least one cleaning chamber for receiving the object and exposing the object to the wet cleaning fluid;
    a transfer mechanism for removing the object from said at least one cleaning chamber; and
    a gas delivery mechanism provided in said at least one cleaning chamber for removing excess cleaning fluid from the object by blowing a purge gas against the object, said gas delivery mechanism having an elongated nozzle slot positioned for ejecting the purge gas across a width of the object.

2. The cleaner of claim 1 further comprising at least one spray nozzle provided in said at least one cleaning chamber for spraying the wet cleaning fluid against the object.

3. The cleaner of claim 1 wherein said at least one cleaning chamber comprises a plurality of cleaning chambers.

4. The cleaner of claim 3 further comprising at least one spray nozzle provided in each of said plurality of cleaning chambers for spraying the wet cleaning fluid against the object.

5. The cleaner of claim 1 wherein said gas delivery mechanism comprises at least one purge bar for blowing the purge gas against at least one surface of the object.

6. The cleaner of claim 5 further comprising at least one spray nozzle provided in said at least one cleaning chamber for spraying the wet cleaning fluid against the object.

7. The cleaner of claim 5 wherein said at least one cleaning chamber comprises a plurality of cleaning chambers.

8. The cleaner of claim 7 further comprising at least one spray nozzle provided in each of said plurality of cleaning chambers for spraying the wet cleaning fluid against the object.

9. The cleaner of claim 1 further comprising a pair of spray nozzle provided in said at least one cleaning chamber for spraying the wet cleaning fluid against respective surfaces of the object and wherein said gas delivery mechanism comprises a pair of purge bars for blowing the purge gas against the respective surface of the object.

10. The cleaner of claim 9 wherein said at least one cleaning chamber comprises a plurality of cleaning chambers.

11. The cleaner of claim 9 wherein said pair of purge bars each comprises a main portion and a nozzle extending from said main portion at an angle of about 45 degrees with respect to said main portion.

12. The cleaner of claim 11 wherein said at least one cleaning chamber comprises a plurality of cleaning chambers.

13. A cleaner for removing excess wet cleaning fluid from a semiconductor wafer, comprising:
- at least two cleaning chambers for receiving the wafer and exposing the wafer to the wet cleaning fluid;
- gas delivery means provided in each of said at least two cleaning chambers for removing excess cleaning fluid from the wafer by blowing a purge gas against respective surfaces of the wafer, said gas delivery means having a pair of elongated nozzle slots positioned for ejecting the purge gas generally perpendicularly against the respective surfaces of the wafer;
- wafer transfer means for transferring said wafer between said at least two cleaning chambers; and
- a controller operably connected to said wafer transfer means and said gas delivery means for actuating said gas delivery means as said wafer transfer means removes the wafer from each of said at least two cleaning chambers.

14. The cleaner of claim 13 further comprising a pair of spray nozzles provided in each of said at least two cleaning chambers for spraying the wet cleaning fluid against the respective surfaces of the wafer.

15. The cleaner of claim 13 wherein said gas delivery means comprises a pair of purge bars for blowing the purge gas against the respective surfaces of the wafer.

16. The cleaner of claim 15 further comprising a pair of spray nozzles provided in each of said at least two cleaning chambers for spraying the wet cleaning fluid against the respective surfaces of the wafer.

17. The cleaner of claim 15 wherein each of said pair of purge bars comprises a main portion and a nozzle extending from said main portion at an angle of about 45 degrees with respect to said main portion.

18. The cleaner of claim 17 further comprising a pair of spray nozzles provided in each of said at least two cleaning chambers for spraying the wet cleaning fluid against the respective surfaces of the wafer.

19. A method of removing excess wet cleaning fluid from a semiconductor wafer, comprising the steps of:
- providing at least one cleaning chamber;
- providing a pair of purge bars in said at least one cleaning chamber, said pair of purge bars each having an elongated nozzle slot having a length at least as great as a width of the semiconductor wafer;
- providing a wafer transfer mechanism in proximity to said at least one cleaning chamber;
- exposing the wafer to the wet cleaning fluid in said at least one cleaning chamber;
- removing the wafer from said at least one cleaning chamber by operation of said wafer transfer mechanism; and
- removing excess cleaning fluid from the object by blowing a purge gas from said pair off purge bars against respective surfaces of the wafer as said wafer transfer mechanism removes the wafer from said at least one cleaning chamber.

20. The method of claim 19 further comprising the steps of operably connecting a controller to said pair of purge bars and said wafer transfer mechanism and automatically operating said pair at purge bars as said wafer transfer mechanism removes the wafer from said at least one cleaning chamber.

* * * * *